(12) United States Patent
Gerdov

(10) Patent No.: US 10,340,669 B1
(45) Date of Patent: Jul. 2, 2019

(54) POWER DISTRIBUTION LOOP WITH FLOW-THROUGH JUNCTION LOCATIONS

(71) Applicant: Amazon Technologies, Inc., Seattle, WA (US)

(72) Inventor: Michael Gerdov, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 171 days.

(21) Appl. No.: 15/636,557

(22) Filed: Jun. 28, 2017

(51) Int. Cl.
| | |
|---|---|
| G06F 1/30 | (2006.01) |
| H02J 9/04 | (2006.01) |
| H02B 1/20 | (2006.01) |
| H05K 7/14 | (2006.01) |
| G06F 1/3287 | (2019.01) |
| G06F 1/3234 | (2019.01) |
| G06F 13/40 | (2006.01) |
| G06F 13/42 | (2006.01) |
| G06F 1/3296 | (2019.01) |

(52) U.S. Cl.
CPC .............. *H02B 1/20* (2013.01); *G06F 1/3253* (2013.01); *G06F 1/3287* (2013.01); *G06F 1/3296* (2013.01); *G06F 13/4022* (2013.01); *G06F 13/4282* (2013.01); *H05K 7/1497* (2013.01)

(58) Field of Classification Search
CPC ... H02G 8/08; H02G 8/16; H02B 1/20; H02B 1/202; H02B 1/22; G06F 13/40; G06F 13/4022; G06F 1/30; G06F 1/26; G06F 1/266
See application file for complete search history.

(56) References Cited

U.S. PATENT DOCUMENTS

| | | | |
|---|---|---|---|
| 8,294,297 B2 * | 10/2012 | Linkhart .................. | H02J 9/06 307/64 |
| 2014/0208129 A1 | 7/2014 | Morales et al. | |
| 2014/0208130 A1 | 7/2014 | Morales et al. | |

OTHER PUBLICATIONS

U.S. Appl. No. 15/070,969, filed Mar. 15, 2016, Osvaldo P. Morales, et al.
U.S. Appl. No. 14/280,340, filed May 16, 2014, Paul William Berg.
U.S. Appl. No. 14/133,525, filed Dec. 18, 2013, Chumock, et al.
U.S. Appl. No. 12/825,198, filed Jun. 28, 2010, Morales, et al.

* cited by examiner

*Primary Examiner* — An T Luu
(74) *Attorney, Agent, or Firm* — Robert C. Kowert; Meyertons, Hood, Kivlin, Kowert & Goetzel, P.C.

(57) ABSTRACT

A facility includes a medium voltage power distribution system with multiple flow-through junction locations and corresponding electrical rooms or spaces for electrical rooms. Each of the junction locations includes a bus connected to the power distribution system, a tap coupled to the bus, and a disconnect switch downstream from the tap. The junction locations of the medium voltage power distribution system are configured to be placed in-service or taken out of service, while the medium voltage power distribution system continues to provide electrical power to electrical rooms at the facility via other junction locations of the medium voltage power distribution system.

20 Claims, 8 Drawing Sheets

POWER DISTRIBUTION LOOP WITH FLOW-THROUGH JUNCTION LOCATIONS

BACKGROUND

A computing facility, such as a data center, may contain a large number of servers, computer networking devices, or other equipment, and as a result a large amount of electrical power may be required to operate the facility. In addition, the electrical power may be distributed to a large number of locations spread throughout the computer room (e.g., many server racks spaced from one another, and many servers in each rack). A network of cabling, bus bars, power connectors, and power distribution units, may be used to deliver the power to numerous specific components in the facility.

A computing facility may receive one or more power feeds from one or more external power sources. For example, a power feed may originate from a utility power source. The power feed originating from a utility power source may be passed along power transmission lines of a utility provider at a high voltage (e.g., 115 kilovolts) to an electrical substation, which may include a transformer that can step down the power feed down to a lower voltage and supply the power feed to the computing facility. Power feeds may be stepped down by a substation transformer to a medium voltage (e.g. 35 kilovolts) that is distributed to additional transformers to be stepped down further to a lower voltage.

Some computing facilities may be expanded over time. However, expansions typically require interruptions in electrical services being provided to the computing facilities to allow additional power distribution equipment to be installed in existing power distribution systems. These interruptions may inhibit a facility's ability to serve its customers. In other cases, some computing facilities may initially be built with excess power distribution capacity. However in such cases, up-front capital costs of power distribution equipment that provide the excess capacity may lead to inefficient capital allocations. For example, in some situations, purchased equipment may not be used for a significant period of time during which investment costs in the equipment are not being recouped by using the equipment to provide services to customers. Additionally during such periods of time the installed but unused equipment may be susceptible to damage or obsolescence.

Figure 1:
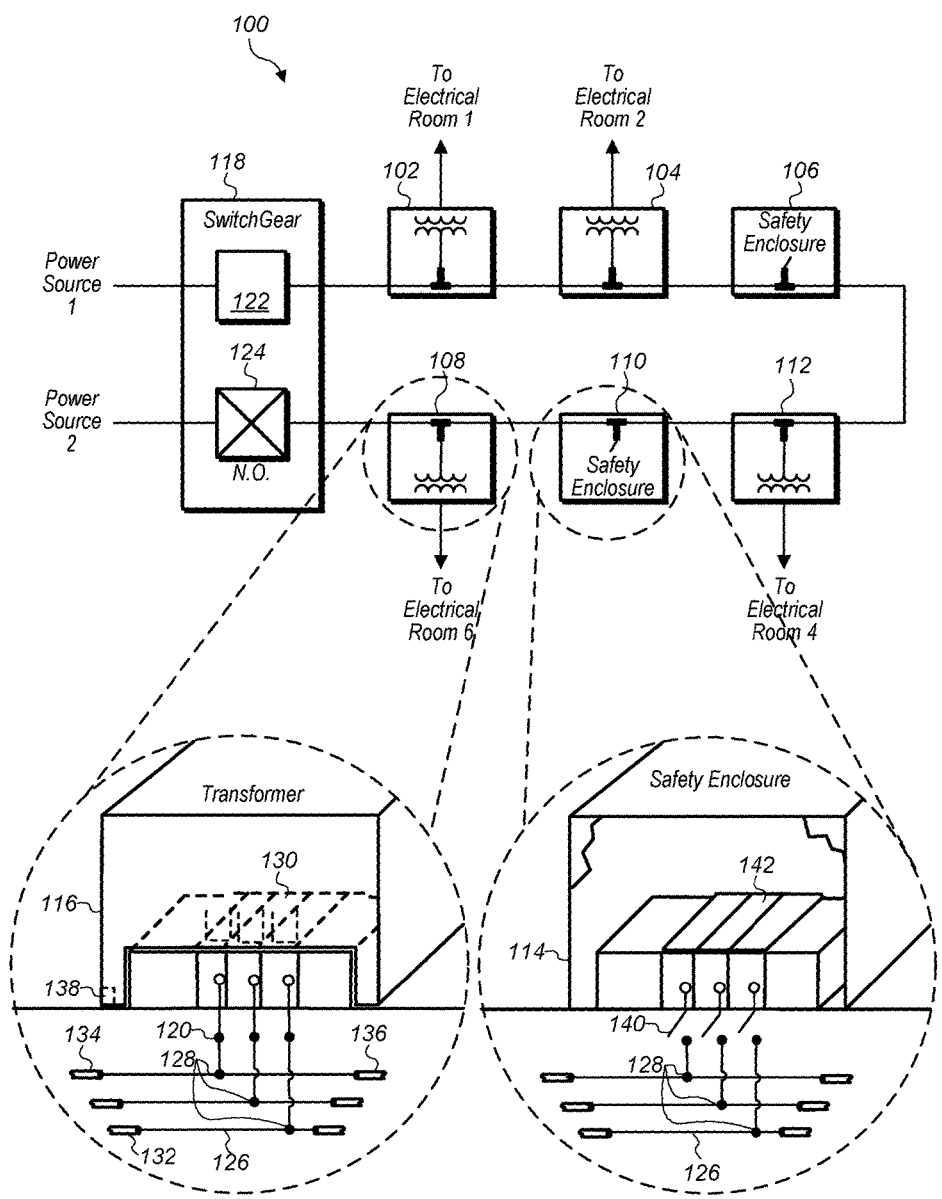
FIG. 1 illustrates a power distribution loop comprising both in-service and not-in-service flow-through junction locations, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of power distribution systems with flow-through junction locations and methods of utilizing power distribution systems with flow-through junction locations are disclosed. According to one embodiment, a data center includes computing rooms and electrical rooms comprising electrical equipment configured to distribute electrical power to the computing rooms. For example, the computing rooms may include rack mounted servers and associated equipment and the electrical rooms may include switching devices, cables, busses, etc. configured to distribute electrical power to the rack mounted servers and associated equipment in the computing rooms. The data center also includes an electrical power distribution loop electrically coupled to a utility power source and configured to distribute electrical power to at least some of the electrical rooms. The electrical power distribution loop includes junction locations, wherein each junction location includes a flow-through bus connected at a first end and a second end to the electrical power distribution loop. Each junction location also includes a tap electrically coupled to the flow-through bus between the first end and the second end and a load side disconnect switch electrically coupled downstream of the tap. While a particular one of the electrical rooms is being connected to or disconnected from a particular one of the junction locations, the flow-through bus of the particular junction location is configured to flow electrical power through the flow-through bus such that electrical power flow through the electrical power distribution loop to electrical rooms electrically coupled to other ones of the junction locations is not interrupted. For example, during an initial phase of operation of a data center some junction locations of an electrical power distribution loop may be electrically coupled to electrical rooms that feed power to one or more computing rooms while other junction locations may not be initially used. Note that even though some of the junction locations may not be initially used to feed electrical power to electrical rooms, electrical power flowing through the electrical power distribution loop may still flow through the flow-through bus of the not-in-service or unused junction locations. In a subsequent expansion phase, an additional electrical room may be connected to an unused or not-in-service junction location of the electrical power distribution loop while electrical power flows through the previously unused or not-in-service junction location. The electrical power flowing through the previously unused or not-in-service junction location may allow electrical rooms connected to the electrical power distribution loop via other ones of the junction locations of the electrical power distribution loop to receive electrical power without interruption while the previously unused or not-in-service junction location is being put in service.

According to one embodiment, a system includes an electrical power distribution system electrically coupled to a utility power source. The electrical power distribution system included multiple junction locations, each comprising: a bus connected at a first end and a second end to the electrical power distribution system, a tap electrically coupled to the bus between the first end and the second end, and a disconnect switch electrically coupled downstream of the tap. Respective junction locations of the electrical power distribution system are electrically coupled to respective electrical rooms of a facility. Also, at least one of the junction locations is not connected to an electrical room at the facility but is configured to be connected to a corresponding electrical room at the facility while electrical power flows through the bus of the at least one junction location and through the electrical power distribution system to the other electrical rooms at the facility electrically coupled to other junction locations of the electrical power distribution system According to one embodiment, a method includes feeding electrical power to electrical rooms electrically coupled to an electrical power distribution system via respective junction locations of the electrical power distribution system, wherein each of the respective junction locations comprises a bus, a tap electrically coupled to the bus, and a disconnect switch between the tap coupled to the bus and a respective one of the electrical rooms that receives electrical power via the respective junction location. The method also includes while feeding electrical power to the electrical rooms via the respective junction locations, connecting an additional electrical room to another junction location of the electrical power distribution system, wherein electrical power flows through the electrical power distribution system while being connected to the additional electrical room.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, one component in a power infrastructure is "downstream" from another component in the system if the one component receives power from the other component or is at a lower level in the system than the other component. For example, a computing room of a data center may be downstream from an electrical room of a data center, or a data center may be downstream from a power plant.

As used herein, an "electrical load", includes the output of a power infrastructure and the electrical power consumed by some or all of the power infrastructure, including the output. For example, an electrical load in a power infrastructure may include a computing room that consumes power distributed over a power distribution system from a power source.

As used herein, a "power source" includes power from any source, including but not limited to power received from a utility power provider that can be supplied to an electrical load.

As used herein, "power transmission line" means a line that transmits power from one component to another component. Power transmission lines may have any form, such as a cable, bus bar, or other conductive member or device.

As used herein, a "rack" means a rack, container, frame, or other element or combination of elements that can contain or physically support one or more computing devices.

As used herein, "switching device" includes a set of electrical switches that can break one or more electrical currents. A switching device can interrupt a power flow, divert one of the source or output of a power feed, etc. For example, a switching device assembly may selectively route or discontinue to route a power feed from a power source to a power output.

As used herein, one component in a system is "upstream" from another component in the system if the one component supplies power to the other component or is at a higher level in the system than the other component. For example, an electrical substation supplying power to a data center may be upstream from the data center, or a transformer may be upstream from an electrical room.

Facilities, such as data centers, are often designed and constructed with a fixed electrical distribution capacity required to support equipment, such as computer systems, that are to be installed in the facilities. In such facilities, adding additional electrical distribution capacity to support additional equipment, such as additional computer systems, often involves time consuming and costly modifications to the existing electrical power distribution system. Also, such modifications often require outages in parts or all of the electrical distribution system to safely connect additional equipment to the existing electrical distribution system. For many facilities, such as data centers that provide computing services to clients, outages related to an existing electrical power distribution system may significantly impact an ability to serve customers and/or cause additional operational costs to be incurred such as costs associated with supplying power from portable generators for an extended period of time.

Additionally, some facilities that are designed and constructed with a fixed electrical distribution capacity may not initially utilize the full electrical distribution capacity. In such circumstances, equipment purchased and installed may go unused for a period of time until customer demand, for example demand for computing services, necessitates utilization of the full electrical distribution capacity of the facility. For example, a data center may be initially designed and constructed with a power distribution capacity to support multiple computing rooms. However, initially demand for computing services may only necessitate a portion of the computing rooms be filled with computer systems, while other computing rooms remain unused or empty. In such circumstances, the data center power distribution system may include equipment such as transformers, busses, switches, etc. installed in the data center to support the unused computing rooms. Capital spent on the unused pieces of electrical equipment may prevent operators of such data centers from investing in other improvements. Also, the installed but unused electrical equipment may deteriorate and/or become obsolete over time. Additionally, power requirements may change over time such that equipment installed at construction but left unused for a period of time may not be properly sized to meet future power requirements. Additionally, operators of such data centers may incur maintenance costs to maintain the unused electrical equipment.

To address at least some of the limitations described above in regard to a power distribution system designed and constructed with a fixed electrical power distribution capacity, a facility, such as a data center, may be constructed with a scalable power distribution system. For example, in some embodiments, a facility may include one or more electrical power distribution loops that include flow-through junction locations.

In some embodiments, a flow-through junction location of an electrical power distribution loop may allow connections to the electrical power distribution loop to be made while electrical power is flowing through the electrical power distribution loop to other loads connected to the electrical power distribution loop via other flow-through junction locations of the electrical power distribution loop. For example, a data center may include an electrical power distribution loop with multiple flow-through junction locations each capable of supporting an electrical room of the data center that supplies one or more computing rooms with electrical power. However, initially only some of the flow-through junction locations of the electrical power distribution loop of the data center may be connected to electrical rooms that supply power to computing rooms of the data center. In such a data center, as computing demand increases additional computing rooms may be placed in service and additional electrical rooms may be connected to previously unused or not-in-service flow-through junction locations of the electrical power distribution loop to support the additional computing rooms while electrical power continues to flow through the electrical power distribution loop to the other electrical rooms already connected to the electrical power distribution loop via other flow-through junction locations.

Additionally, in some embodiments, installation of electrical equipment and electrical infrastructure downstream of a flow-through junction location, such as a medium voltage transformer, electrical room equipment, cables, busses, etc., may be deferred until the electrical equipment is needed to support additional computing rooms. For example, some transformers, cables, busses, switches, etc. may not be initially purchased or installed when an electrical power distribution loop with flow-through junction locations is constructed. The transformers, cables, busses, switches, etc. may later be purchased and installed as needed to support capacity increases at a data center. Thus, initial capital costs may be reduced for construction of a power distribution system for a facility that includes an electrical power distribution loop with flow-through junction locations. Also, risks of deterioration and obsolescence of unused installed equipment may be reduced. Additionally, maintenance costs associated with maintaining installed but unused electrical equipment may be reduced.

FIG. 1 illustrates a power distribution loop comprising both in-service and not-in-service flow-through junction locations, according to some embodiments.

Power distribution loop 100 includes flow-through junction locations 102, 104, 106, 108, 110, and 112. A power distribution loop with flow-through junction locations, such as power distribution loop 100, may be used to distribute electrical power to portions of a facility, such as electrical rooms of a data center. For example, flow-through junction locations 102, 104, 108, and 112 are coupled with and configured to distribute electrical power to electrical rooms 1, 2, 4, and 6, respectively of a data center. The electrical rooms, for example electrical rooms 1, 2, 4, and 6, may in turn supply electrical power to computing rooms of the data center, wherein each computing room comprises computer systems that consume electrical power received from a corresponding electrical room of the data center. Power distribution loop 100 also includes flow-through junction locations 106 and 110 that are not electrically coupled to an electrical room and are instead covered with a safety enclosure 114. These flow-through junction locations may initially be unused or not in service.

While power distribution loop 100 is illustrated with 6 flow-through junction locations, in some embodiments, a power distribution loop may include any number of flow-through junction locations. For example, in some embodiments, power distribution loop 100 may include 6, 8, 9, 10, 11, 12, or any other number of flow-through junction locations.

In some embodiments, a power distribution loop with flow-through junction locations may be directly coupled to power equipment managed by a utility power provider via one or more switching devices. Directly coupling a power distribution loop to a utility provider may eliminate one or more pieces of electrical equipment typically used in traditional facility power distribution systems such as intermediate switching devices coupled between a main switchgear directly coupled to a utility power provider and a transformer that converts medium voltage power to low voltage power. For example power distribution loop 100 may be directly coupled to power source 1 and/or power source 2 via switchgear 118, wherein power source 1 or power source 2 is a direct connection to a utility power provider. In some embodiments, a power distribution loop may distribute medium voltage electrical power (e.g. power at approximately 34 kilovolts) received directly from a utility power provider. In some embodiments, a power distribution loop with flow-through junction locations, such as power distribution loop 100, may be electrically coupled to an electrical sub-station operated by a utility power provider that transforms high-voltage power (e.g. power at or above approximately 115 kilovolts) received from high-voltage transmission lines to medium voltage power. The power distribution loop with flow-through junction locations may distribute the medium voltage power to junction locations. Junction locations may include or be coupled with a transformer that converts the medium voltage power to low voltage power. The low voltage power may then be distributed to an electrical room of a facility and ultimately to a computing room of the facility.

In some embodiments, a power distribution loop with flow-through junction locations may be configured to flow a significant amount of medium-voltage power, for example 400 amps or more of 30 kilovolt or greater voltage power. In some embodiments, components, of a power distribution loop with flow-through junction locations may include equipment with even greater electrical ratings. For example, in some embodiments, a disconnect switch, such as one of disconnect switches 120, may be rated to flow as much as 600 amps of medium voltage power or more. In some embodiments, a power distribution system with flow-through junction locations may be rated to distribute 15 megawatts (MW) or more of electrical power.

In some embodiments, flow-through junction locations of a power distribution loop may include transformers or may have transformers associated with the flow-through junction locations. For example, junction locations 102, 104, 108, and 112 are electrically coupled to transformers 116. A transformer, such as one of transformers 116, may convert medium voltage power received from a power distribution loop (e.g. power at or about 34 kilovolts) into low voltage power (e.g. power at or about 480 volts). The low voltage power may then be distributed to one or more electrical rooms. The electrical rooms may further lower the voltage of the low-voltage power and distribute the low voltage power to one or more computing rooms. The one or more computing room may include respective power distribution systems within the computing rooms to distribute electrical power to computer systems in the computing rooms.

In some embodiments, a power distribution loop with flow-through junction locations may include a switching device, such as switchgear 118, that is electrically coupled to more than one power source, such as power sources 1 and 2. The switching device may be coupled to the power distribution loop with flow-through junction locations such that power may be fed through the power distribution loop with flow-through junction locations from any one of the power sources electrically coupled to the switching device. For example, switch 122 of switchgear 118 is closed and switch 124 of switchgear 118 is open. Switch 118 corresponds to power source 1 and switch 124 corresponds to power source 2. Thus, when switch 122 is closed and switch 124 is open, electrical power is fed to power distribution loop 100 from power source 1. However, if power is lost from power source 1 or for various other reasons, electrical power may be fed from power source 2. To feed power from power source 2, switch 124 may be closed and switch 122 may be opened. In some embodiments, switches, such as switches 122 and 124, may be automatically operated to switch between power sources. For example, in case of a loss of power from power source 1, switch 122 may automatically open and switch 124 may atomically close to cause power flowing through power distribution loop 100 to be fed from power source 2.

FIG. 1 includes a more detailed view of in-service junction location 112 and not-in-service junction location 110. Any of the in-service junction locations 102, 104, and 108 may include similar components as shown for in-service junction location 112. Also, not-in-service junction location 106 may include similar components as shown for not-in-service junction location 110.

Junction location 112 includes flow-through bus 126, taps 128 electrically coupled to flow-through bus 126, and disconnect switch 120 electrically coupled downstream of taps 128. Also, junction location 112 includes connection plate 130 electrically coupled with transformer 116. In some embodiments, a connection plate, such as connection plate 130, may include separate connectors, such as fingers, that are configured to couple with corresponding connectors of a transformer to electrically couple the transformer to a junction location. For example, a power distribution loop may distribute three-phase power and a connection plate may include separate connectors for each of the three-phases of the three-phase power. In some embodiments, a junction location may include multiple connectors for each phase of a three-phase system. Multiple connectors may allow for higher capacity electrical power distribution. In some embodiments, a disconnect switch, such as disconnect switch 120, may have a greater power rating than a power rating of an overall power distribution loop. For example, in some embodiments, disconnect switch 120 may be configured to flow up to 600 amps of medium voltage power, whereas power distribution loop 100 may be rated to flow 400 amps of medium voltage power. In some embodiments, a disconnect switch of a junction location, such as disconnect switch 120, may include grounding such that a connection plate coupled to the disconnector switch is connected to ground when the disconnect switch is not in a closed position.

In some embodiments, a power distribution loop with flow-through junction locations, such as power distribution loop 100, may be buried underground and each junction location may include a connection plate above ground. Also, in some embodiments, a junction location may include lengths of above ground cables in addition to or in place of a connection plate. In some embodiments, an underground portion of a power distribution loop with flow-through junction locations may include buried cables or busses. In some embodiments, components of an underground portion of an electrical power distribution loop with flow through-junction locations, such as buried cables or busses, may be rated to distribute 15 megawatts (MW) of electrical power or more. In some embodiments, a junction location, such as junction location 112, may include elbow terminations on either end of a flow-through bus, wherein the elbow terminations are electrically coupled on respective other sides of the elbow terminations with the power distribution loop. For example, junction location 112 includes elbow terminations 132 on a first end 134 and a second end 136 of flow-through bus 126. In some embodiments, a disconnect switch, such as disconnect switch 120, is connected to a bus between elbow terminations via a tap. For example, disconnect switch 120 is electrically coupled to flow-through bus 126 that runs between elbow terminations 132 at first end 134 and second end 136 of flow-through bus 126 via taps 128.

In some embodiments, a junction location, such as junction location 112, may include a key, such as key 138. A key may be configured such that the key causes a disconnect switch of the junction location to open when the key is unlocked. Also, the key may prevent a transformer from being removed while the key is locked. Thus, a key may prevent a transformer from being removed while a disconnect switch of the junction location is closed and a connection plate of the junction location is energized.

As described above, a power distribution loop with flow-through junction location may include both in-service and not-in-service junction locations. FIG. 1 also illustrates a more detailed view of not-in-service junction location 110. Not-in-service junction location 110 includes similar components as junction location 112. However, a transformer is not installed at junction location 110 and junction location 110 is not electrically coupled to an electrical room. Also, disconnect switch 140 of junction location 110 is in an open position. Also, in some embodiments, disconnect switch 140 may be connected to a grounding bus while in the open position. Thus, connection plate 142 of junction location 110 may be un-energized and grounded. Also, a not-in-service junction location, such as junction location 110, may include a safety enclosure, such as safety enclosure 114. A safety enclosure may be a metal box or other type of enclosure that covers a not-in-service junction location to both isolate the junction location and to prevent unauthorized access to the junction location.

In some embodiments, a power distribution loop with feed-through junction locations may be included in a data center that is being built in phases or that is being expanded. The not-in service junction locations of a power distribution loop with flow-through junction locations may allow additional phases to be added to a data center or a data center to be expanded without interrupting electrical power distribution to already in service parts of the data center, such as parts of the data center that receive electrical power from in-service junction locations of the power distribution loop that includes the not-in-service junction locations.

Figure 2:
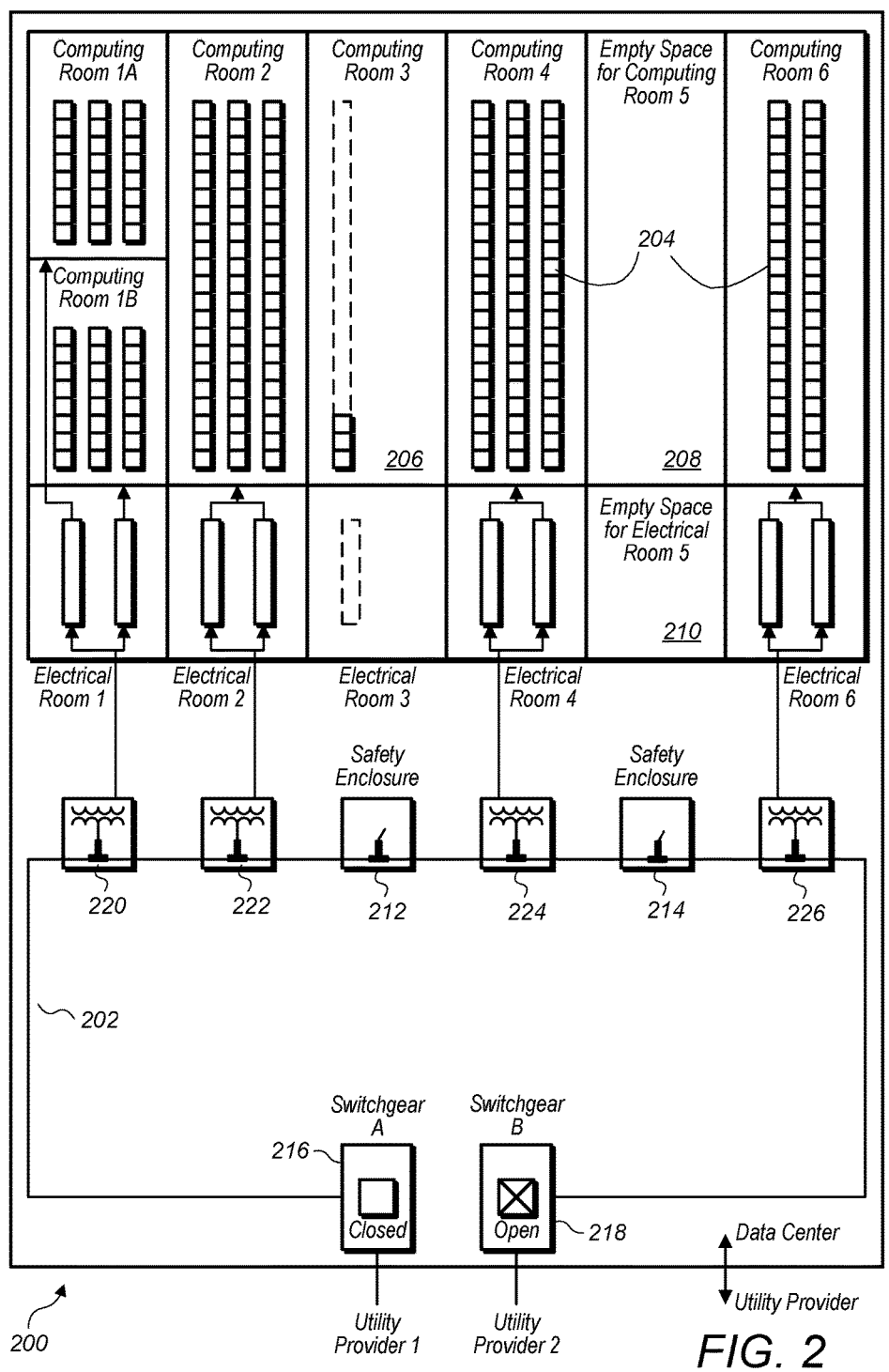
FIG. 2 illustrates a data center comprising a power distribution loop with both in-service and not-in-service flow-through junction locations, according to some embodiments.

FIG. 2 illustrates a data center comprising a power distribution loop with both in-service and not-in-service flow-through junction locations, according to some embodiments.

Data center 200 includes a power distribution loop 202 with flow-through junction locations. Power distribution loop 202 may be the same as power distribution loop 100 described in FIG. 1. Data center 200 also includes computing rooms 1A, 1B, 2, 4, and 6 that each comprise rack mounted computer systems 204. Additionally data center 200 includes space 206 that is being converted into computing room 3 and space 208 that is presently empty but can be converted into computing room 5 in the future. Data center 200 also includes electrical rooms 1, 2, 3, 4, and 6. Additionally data center 200 includes space 210 for electrical room 5.

In some embodiments, a power distribution loop with flow through junction locations may be directly coupled to a utility provider, for example a power distribution loop with flow-through junction locations may be connected via one or more transmission lines to an electrical sub-station of a utility provider. In some embodiments, a power distribution loop with flow-through junction location may be directly coupled at a first end of the loop with a first utility provider and directly coupled at a second end of the loop with a second utility provider. For example, power distribution loop 202 is directly coupled with utility provider 1 via switchgear 216 and is directly coupled with utility provider 2 via switchgear 218. In some embodiments, a power distribution loop with flow-through junction locations may be used in place of one or more intermediate switches that are typically included at a facility in a power distribution system between a main switchgear that is directly coupled to a utility power source and electrical rooms that receive electrical power from the power distribution system. However, in some embodiments, one or more intermediate switches may be included between a facility's connection to a utility power provider and a power distribution loop with flow-through junction locations. In some embodiments, a power distribution loop with flow-through junction locations, such as power distribution loop 202, may receive medium voltage power (e.g. power at approximately 35 kilovolts) from either utility power provider 1 or utility power provider 2.

In some embodiments, spaces in a data center, such as spaces 208 and 210, may be empty space in a building or may be an undeveloped site where a building may be constructed. In some embodiments, empty spaces, such as spaces 208 and 210, may be yet-to-be acquired land that may be acquired in the future to expand a facility, such as a data center site. In some embodiments, a power distribution loop with flow-through junction locations, such as power distribution loop 202, may be included in a data center building. For example, power distribution loop 202 may be buried beneath a floor of a data center building. Also, in some embodiments, a power distribution loop, such as power distribution loop 202, may be located in a space outside of a data center building, but at a data center site. For example, power distribution loop 202 may be buried below ground in an area adjacent to a data center building or set of buildings.

As a facility, such as a data center, is expanded, additional electrical power distribution capacity may be needed. In order to provide additional power distribution capacity one or more currently not-in-service junction locations of a power distribution loop with flow-through junction locations at the facility may be converted into in-service junction locations that are electrically coupled to an electrical load at the facility. For example, junction location 212 may be converted from a not-in-service junction location to an in-service junction location and may be electrically coupled to electrical room 3 to provide electrical power to computing room 3 of data center 200. Additionally, at a later point in time or concurrently, junction location 214 may be converted from a not-in-service junction location to an in-service junction location. Junction location 214 may also be connected to an electrical room constructed in space 210, for example an electrical room 5. The electrical room constructed in space 210 may provide electrical power to a computing room, such as a computing room 5, constructed in space 208.

In some embodiments, converting a not-in-service junction location to an in-service junction location may include removing a safety enclosure, installing a transformer at the junction location, connecting the transformer to a downstream load, such as an electrical room, and closing a disconnect switch to complete an electrical connection with the power distribution loop of which the junction location is a part.

Figure 3A:
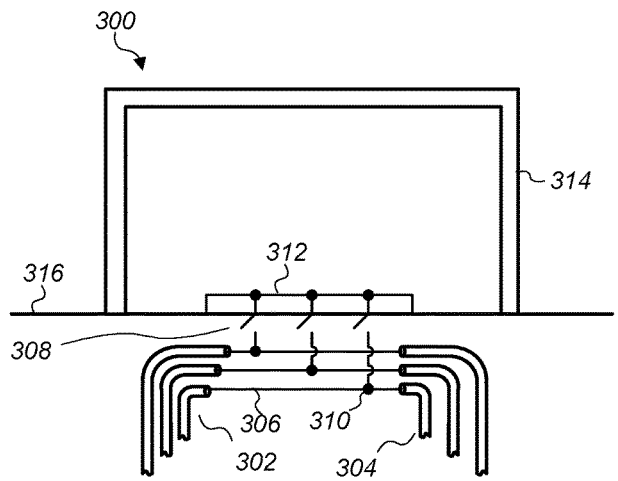
FIG. 3A illustrates a not-in-service flow-through junction location covered by a safety enclosure, according to some embodiments.
Figure 3B:
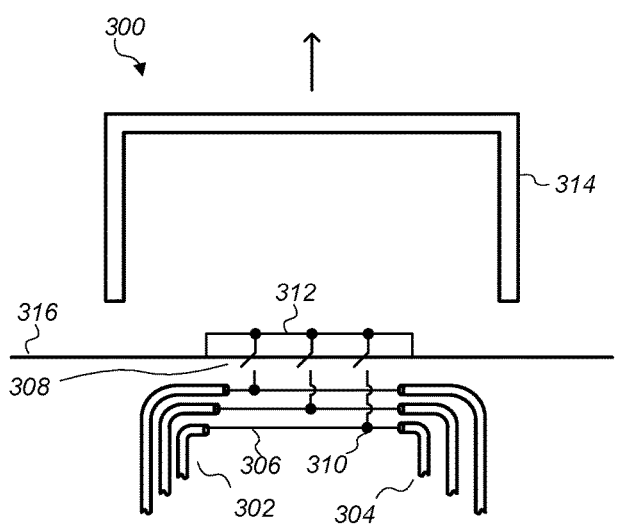
FIG. 3B illustrates a safety enclosure being removed from a not-in-service flow-through junction location to put the junction location in service, according to some embodiments.
Figure 3C:
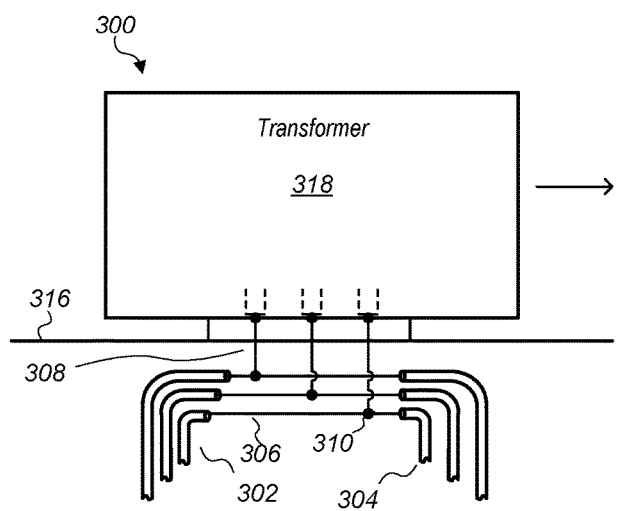
FIG. 3C illustrates a transformer installed on a flow-through junction location that has been put in service, according to some embodiments.

FIGS. 3A-3C illustrate a not-in-service flow-through junction location covered by a safety enclosure being put in service, according to some embodiments. Junction location 300 illustrated in FIGS. 3A-3C may be any of the junction locations described in FIG. 1-2 or 5-8. Junction location 300 includes elbow terminations 302 and 304 on either side of flow-through bus 306. Junction location 300 also includes disconnect switches 308 coupled downstream of tap connections 310 to flow-through bus 306. Connection plate 312 is coupled downstream of disconnect switches 308. When a flow-through junction location, such as junction location 300, is not in service a disconnect switch of the flow-through junction may be open and grounded. For example, disconnect switches 308 are open such that connection plate 312 is not electrically connected to flow-through bus 306. In some embodiments, disconnect switches may further include a grounding bus, such that connection plate 312 is connected to ground when the disconnect switches are open. In addition, a not-in-service junction location, such as junction location 300, may include a safety enclosure, such as enclosure 314. When a given junction location is not in service, electrical power may flow through a flow-through bus of the given location, but a connector, such as a connection plate or cable connector downstream of an open disconnect switch of the given junction location may not be energized. The non-energized connector of the given junction location may be connected to ground.

In some embodiments, some parts or all of a junction location may be mounted below grade. For example, flow-through bus 306, taps 310, and disconnect switches 308 of junction location are situated below grade level 316. In some embodiments, some components or all components of a junction location may be mounted below ground or above ground.

When, a flow-through junction location is to be put in service, a safety enclosure may be removed from the junction location. For example, safety enclosure 314 is being removed from junction location 300 in FIG. 3B. In some embodiments, a safety enclosure may include a key or other type of interlock that does not allow the safety enclosure to be removed from the flow-through junction location unless a disconnect switch of the flow-through junction location, such as all of disconnect switches 308, are opened and/or grounded.

Further, once a safety enclosure is removed from a not-in-service junction location, a transformer may be installed at the junction location. In some embodiments, a transformer and a junction location may each include matching connection plates configured to couple with each other to electrically connect a transformer to a junction location. For example, transformer 318 may include a connection plate configured to match with connection plate 312 of junction location 300.

In some embodiments, instead of or in addition to matching connection plates, cables or busses may be used to connect a transformer to a junction location.

Figure 4A:
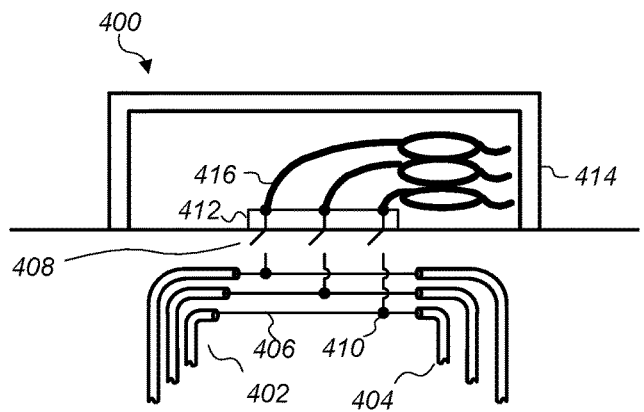
FIG. 4A illustrates a not-in-service flow-through junction location comprising lengths of cable covered by a safety enclosure, according to some embodiments.
Figure 4B:
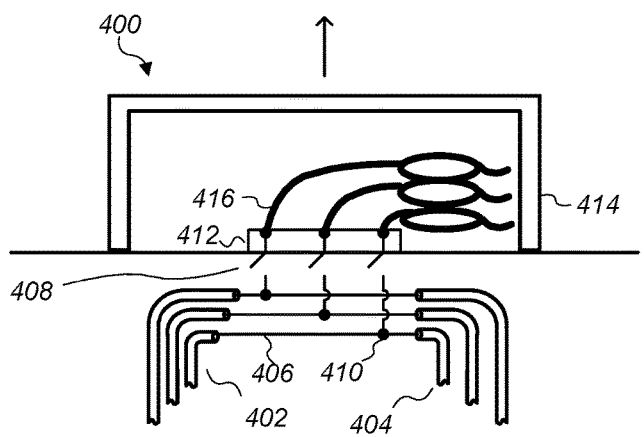
FIG. 4B illustrates a safety enclosure being removed from a not-in-service flow-through junction location to put the junction location in service, according to some embodiments.
Figure 4C:
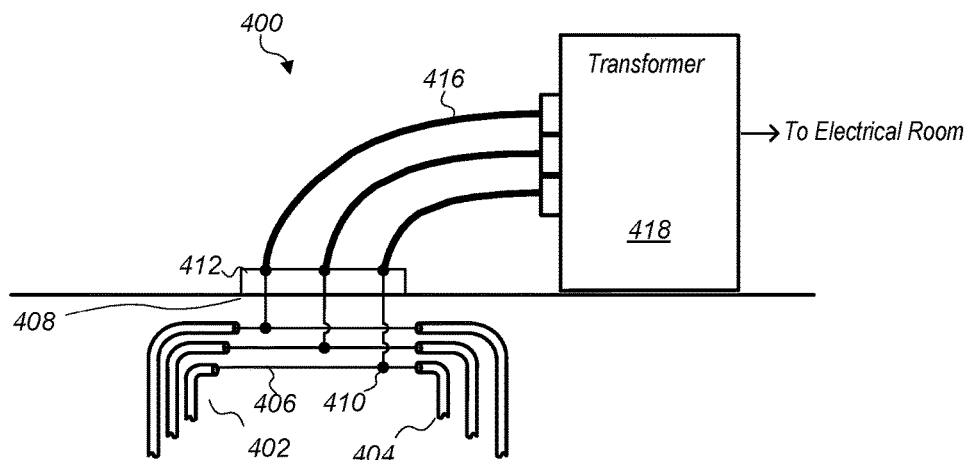
FIG. 4C illustrates a transformer installed at a flow-through junction location that has been put in service, according to some embodiments.

FIGS. 4A-4C illustrate a not-in-service flow-through junction location comprising lengths of cable covered by a safety enclosure being placed in service, according to some embodiments. Junction location 400 illustrated in FIGS. 4A-4C may be any of the junction locations described in FIG. 1-2 or 5-8. Junction location 400 includes elbow terminations 402 and 404 on either side of flow-through bus 406. Junction location 400 also includes disconnect switches 408 coupled downstream of tap connections 410 to flow-through bus 406. Connector interface 412 is coupled downstream of disconnect switch 408. Lengths of cables 416 are connected to connector interface 412. In some embodiments, lengths of cables, such as lengths of cables 416, may be included in a junction location when the junction location is not in service, or, in other embodiments, lengths of cables, such as lengths of cables 416, may be stored elsewhere or acquired when needed. When a flow-through junction location, such as junction location 400, is not in service a disconnect switch of the flow-through junction may be open and grounded. For example, disconnect switches 408 are open such that lengths of cables 416 are not energized. In addition, a not-in-service junction location, such as junction location 400, may include a safety enclosure, such as enclosure 414. In a similar manner as described in regard to safety enclosure 314 in FIGS. 3A-3C, safety enclosure 414 may be removed as part of placing junction location 414 in service. However, as opposed to a transformer mounting on a connection plate of a junction location, such as described in FIG. 3C, in some embodiments a transformer may mount on a pad adjacent to a junction location and may be electrically coupled to the junction location via electrical connectors, such as cables or busses. For example, in FIG. 4C transformer 418 is mounted adjacent to connection interface 412 of junction location 400 and is electrically coupled to junction location 400 via cables 416 and connection interface 412. While, not shown in FIG. 4C, in some embodiments, a safety enclosure may be re-installed over a connection interface, such as connection interface 412, once a transformer is connected to the connection interface.

The flow through-bus of a flow-through junction location along with the disconnect of a flow-through junction location may allow a not-in-service junction location to be converted to an in-service junction location while electrical power flows through a power distribution loop to which the flow-through bus of the junction location is electrically coupled.

The junction locations as described in FIGS. 3A-3C and FIGS. 4A-4C may be any of the junction locations described herein such as junction locations 212 and 214 illustrated in FIG. 2 that are being put-in-service and coupled to electrical rooms 3 and 5 respectively.

Figure 5:
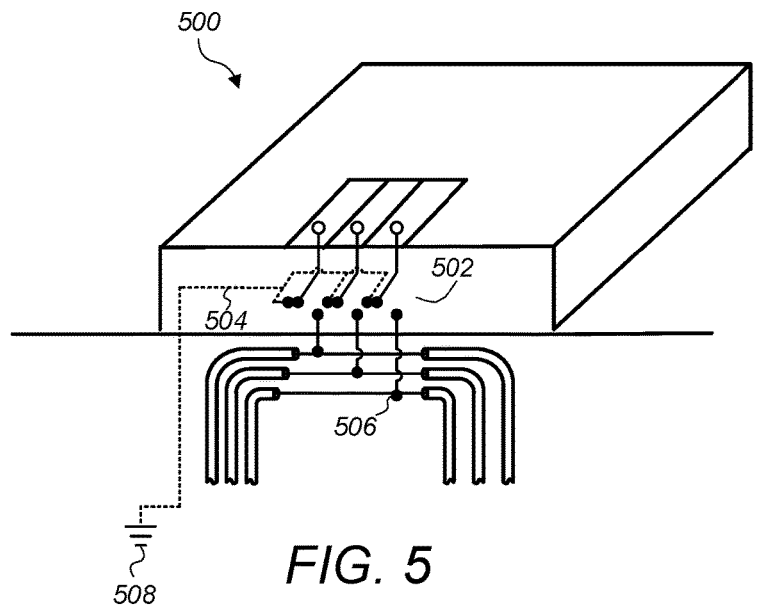
FIG. 5 illustrates a disconnect switch of a flow-through junction location that includes a grounding bus, according to some embodiments.

FIG. 5 illustrates a disconnect switch of a flow-through junction location that includes a grounding bus, according to some embodiments. Any of the junction locations described herein, may include a disconnect switch and a grounding bus as shown in FIG. 5. For example, junction location 500 includes disconnect switches 502, taps 506, and ground bus 504 with ground connection 508. In some embodiments, a disconnect switch, such as one of disconnect switches 502, may be configured such that in the closed position the disconnect switch completes a circuit with a tap connected to a flow-through bus, such as one of taps 506. Also, in an open position the disconnect switch may complete a circuit with a ground connection to ground a connection plate or connection interface of the junction location. For example, disconnect switches 502 in the open position are connected to ground bus 504 and connect connection plate 510 to ground connection 508. Connecting a connection plate or connection interface to ground may help ensure safety of workers while connecting or disconnection equipment to a connection plate or connection interface. In some embodiments, a ground connection may be included downstream of a disconnect switch. For example, a junction location may include connectors downstream of a disconnect switch configured to couple with a ground bus when the disconnect switch is in an open position.

In some embodiments, a junction location may include an associated switching device downstream of a transformer installed at the junction location. A switching device may allow an alternate electrical power source, such as a generator, to feed electrical power to downstream loads, while a transformer at the junction location is being replaced or otherwise worked on.

Figure 6:
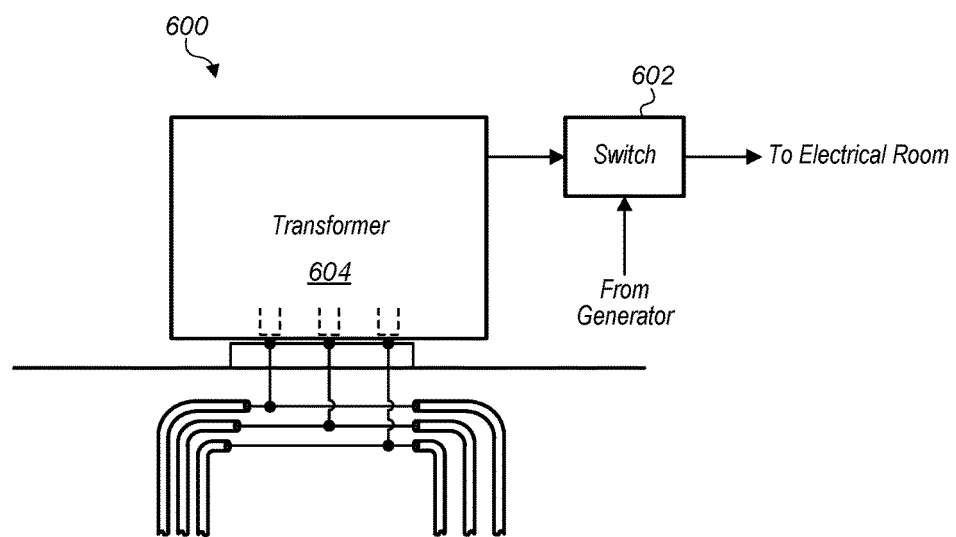
FIG. 6 illustrates an in-service flow-through junction location and associated switchgear coupled to a generator, according to some embodiments.

FIG. 6 illustrates an in-service flow-through junction location and associated switchgear coupled to a generator, according to some embodiments. Switching device 602 at junction location 600 is coupled between transformer 604 and an electrical room associated with junction location 600.

In some embodiments, switching device 602 may be coupled to a permanent or temporary generator or other power source to provide power to electrical rooms associated with junction location 600 while transformer 604 is being replaced or otherwise worked on.

In some embodiments, junction locations of an electrical power distribution loop may allow for different sized transformers to be installed. Also, in some embodiments, a facility, such as a data center, may include multiple electrical power distribution loops with flow-through junction locations.

Figure 7:
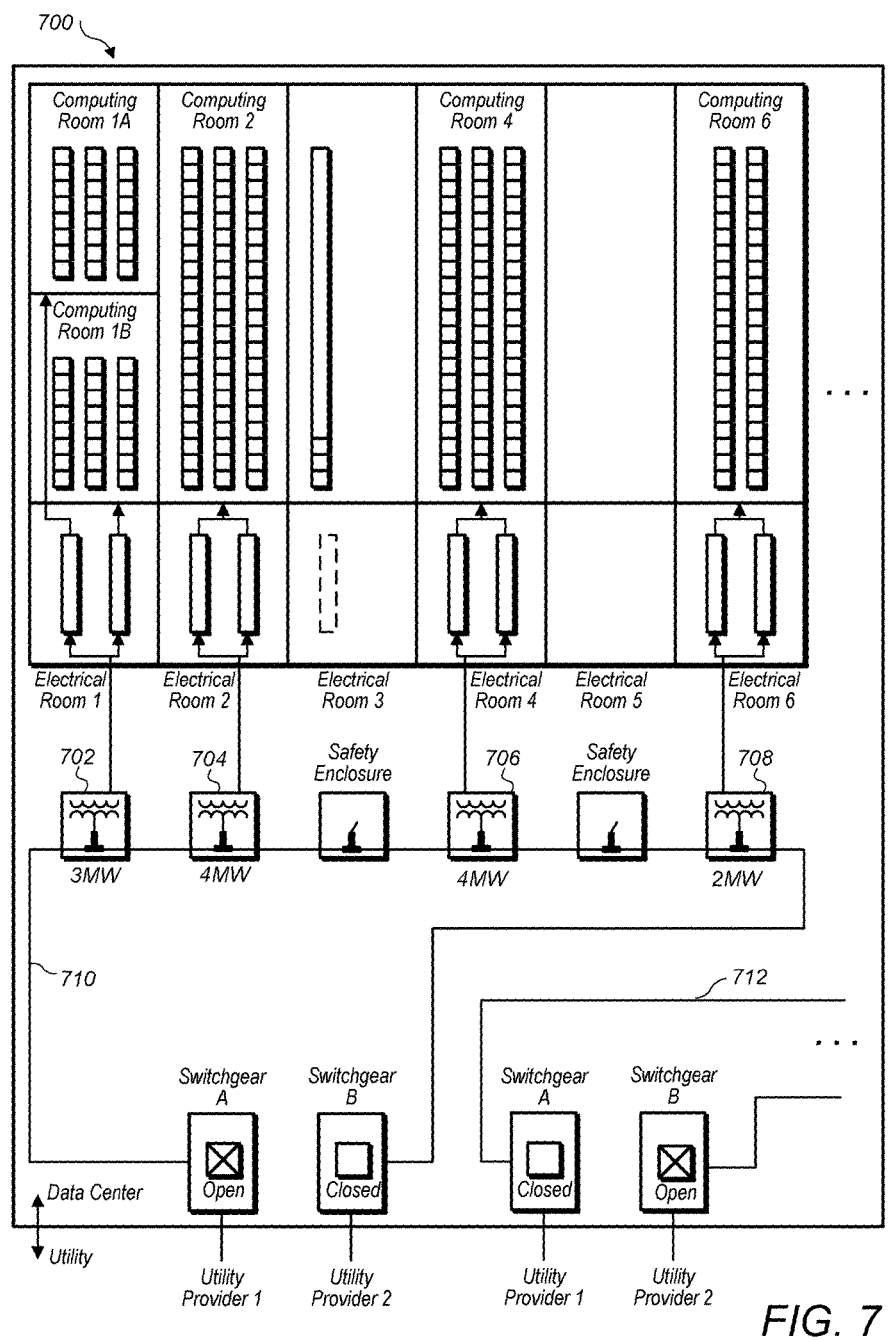
FIG. 7 illustrates a data center comprising multiple power distribution loops with flow-through junction locations, according to some embodiments.

FIG. 7 illustrates a data center comprising multiple power distribution loops with flow-through junction locations, according to some embodiments. Data center 700 may be a similar data center as data center 200 described in FIG. 2. However, in some embodiments, a data center, such as data center 700 may include different sized transformers coupled at different junction locations of a power distribution system with flow-through junction locations. For example, data center 700 includes a 3 megawatt transformer at junction location 702 and 4 megawatt transformers at junction locations 704 and 706. In some embodiments, data center 700 may have been initially commissioned with only a single electrical room 1 connected at junction location 702. Due to increases in demand for computing services, at a subsequent point in time transformers may have been installed at junction locations 704 and 706. However, at the subsequent point in time, different types of computing device or different quantities of computing devices may have been installed in computing rooms 2 and 4 that correspond with electrical rooms 2 and 4. Thus, different sized transformers may have been needed to supply electrical rooms 2 and 4. Also, at another point in time or at the same time when the data center was originally commissioned or expanded, a smaller transformer, for example a 2 megawatt transformer, may have been installed at junction location 708 to supply electrical power to electrical room 6 that supports computing room 6. As can be seen junction locations of an electrical power distribution loop with flow-through junction locations allow for different sized transformers to be installed at the respective junction locations based on different or changing power requirements of loads that are fed by the junction locations. This allows more flexibility than is available in electrical power distribution systems that include a full set of transformers installed prior to initial commissioning. Note that transformer sizes of 2 megawatts, 3 megawatts, and 4 megawatts are given only as examples for clarify of illustration. In some embodiments various other size transformers may be installed at a junction location.

Also, in some embodiments, a facility, such as a data center, may include more than one electrical power distribution loop with flow-through junction locations. In some embodiments, additional electrical power distribution loops with flow-through junction locations may be added to a facility as the facility is expanded. For example, a data center may be initially constructed with one or more electrical power distribution loops with flow-through junction locations. As not-in-service junction locations are converted into in-service junction locations, one or more additional electrical power distribution loops with flow-through junction locations may be added to the data center to provide additional not-in-service junction locations for future or current expansion. For example, data center 700 includes electrical power distribution loop 710 and one or more additional electrical power distribution loops 712.

Figure 8:
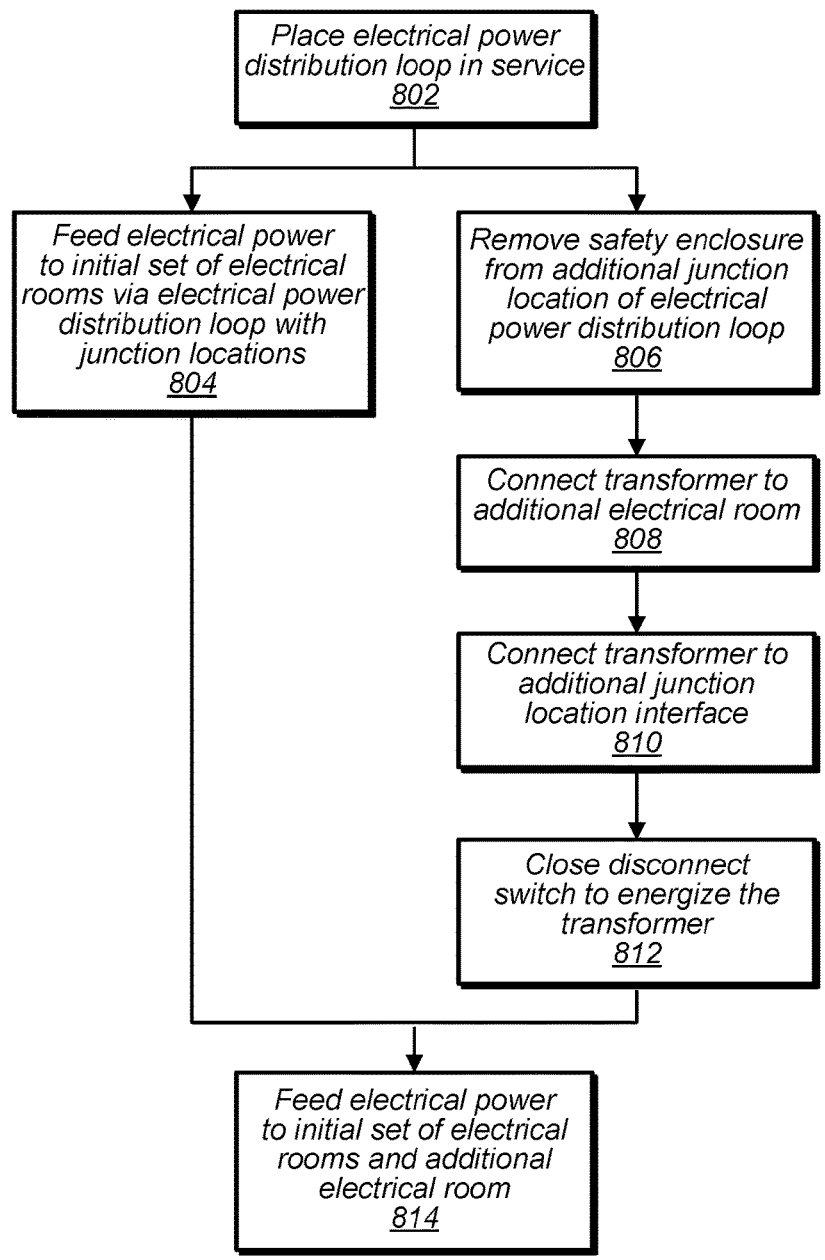
FIG. 8 is a flow diagram illustrating a not-in-service flow-through junction location of a power distribution loop being placed in service while in-service flow-through junction locations of the power distribution loop distribute power to loads, according to some embodiments.

FIG. 8 is a flow diagram illustrating not-in-service flow-through junction location of a power distribution loop being placed in service while in-service flow-through junction locations of the power distribution loop distribute power to loads, according to some embodiments. The process described in regard to FIG. 8 could be performed on any of the power distribution loops with flow-through junction locations described herein, such as power distribution loop 100 shown in FIG. 1, power distribution loop 202 shown in FIG. 2, power distribution loop 710 or additional power distribution loops 712 shown in FIG. 7.

At 802 an electrical power distribution loop is placed in service. In some embodiments, an electrical power distribution loop may be placed in service with some junction locations of the electrical power distribution loop connected to loads at a facility and with other junction locations of the electrical power distribution loop not in service. For example, as shown in FIG. 2, power distribution loop 200 of data center 200 may be placed in service with junction locations, such as junction locations 220, 222, 224, and 226 in service and connected to electrical rooms 1, 2, 4, and 6 and the corresponding loads in computing rooms 1A, 1B, 2, 4, and 6. Meanwhile, some of the junction locations of power distribution loop 200, such as junction locations 212 and 214 may not be connected to corresponding electrical rooms and may not be providing electrical power to loads.

At 804 electrical power is fed to an initial set of electrical rooms connected to the electrical distribution loop. While electrical power is being fed to the initial set of electrical rooms, one or more additional electrical rooms may be connected to previously not-in-service junction location. For example, at 806 a safety enclosure is removed from a not-in-service junction location that is an additional junction location of the electrical power distribution loop in addition to the initial set of junction locations of the electrical power distribution loop. In some embodiments, a safety enclosure of a junction location may include an interlock or other type of device that prevents the safety enclosure from being removed from the junction location unless a disconnect switch of the junction location is opened and connected to a ground connection. For example, as shown in FIG. 2 additional computing devices may be installed in a computing room, such as computing room 3, while electrical power is being fed to other computing rooms such as computing rooms 1, 2, 4, and 6 via junction locations 220, 222, 224, and 226. While electrical power is flowing to computing rooms 1, 2, 4, and 6 and through flow-through junction locations 212 and 214, a safety enclosure may be removed from flow-through junction location 212 to prepare the junction location to be connected to electrical room 3. Because each flow-through junction location includes disconnect switches coupled downstream of tap connections to a flow-through bus of the electrical power distribution loop 200, the junction locations can be safely isolated from the flow-through bus while electrical power continues to flow through the flow-through bus. For example, junction location 212 includes one or more disconnect switches downstream of a tap connected to electrical power distribution loop 200 that allows junction location 212 to be safely connected to electrical room 3 while power flows through a flow-through bus of junction location 212.

At 808 an additional transformer is connected to an electrical room that corresponds with the previously not-in-service junction location that is to be placed in service. For example, an additional transformer may be connected to the electrical room 3 illustrated in FIG. 2.

At 810 the additional transformer is connected to the previously not-in-service junction location to add an additional in-service junction location to the electrical power distribution loop. For example, the additional transformer, as described above, may then also be connected to junction location 212 after the safety enclosure is removed from junction location 212. At 812 the disconnect switch of the junction location is closed to energize the additional transformer and to feed electrical power to the electrical room connected to the additional transformer. For example, a disconnect switch, such as disconnect switch 308 shown in FIG. 3 may be closed to energize a transformer, such as an additional transformer installed at a junction location, such as an additional transformer installed at junction location 212 as described above. In some embodiments, the disconnect switch may be remotely operated, such that the disconnect switch can be closed without a person physically at the junction location.

At 814 electrical power is fed to the initial set of electrical rooms connected to the initial set of junction locations and is fed to the additional electrical room connected to the additional junction location that has been placed in service. Note that electrical power continued to flow to the initial set of electrical rooms (804) while steps 806, 808, 810, and 812 were performed. Thus, additional electrical distribution capacity can be added to a power distribution system of a facility, such as a data center, while existing electrical rooms receive power from the power distribution system that is being expanded. For example, electrical power may continue to flow to electrical rooms 1, 2, 4, and 6 while electrical room 3 is being connected to power distribution loop 200 illustrated in FIG. 2.

Figure 9:
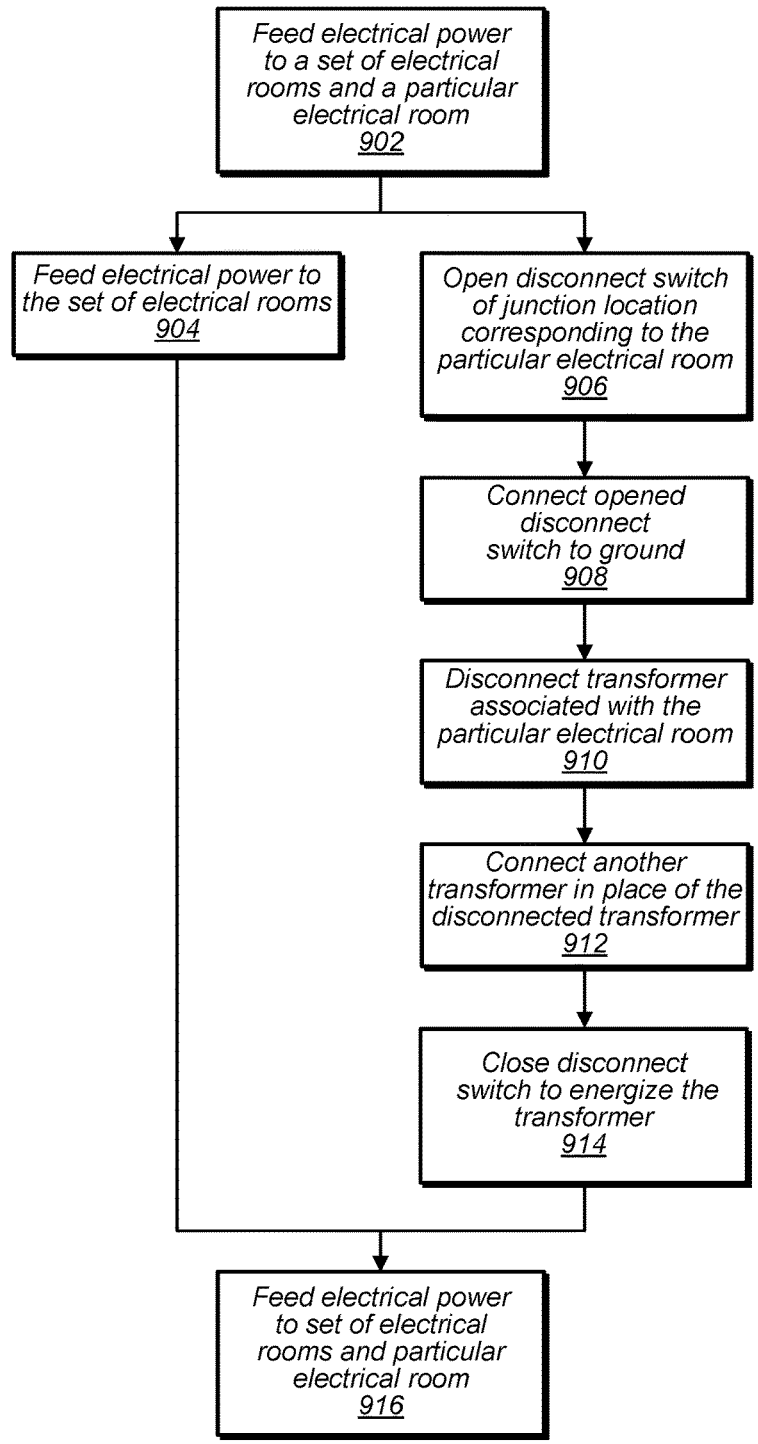
FIG. 9 is a flow diagram illustrating a transformer associated with a flow-through junction location of a power distribution loop being replaced while in-service flow-through junction locations of the power distribution loop distribute power to loads, according to some embodiments.

FIG. 9 is a flow diagram illustrating a transformer associated with a flow-through junction location of a power distribution loop being replaced while in-service flow-through junction locations of the power distribution loop distribute power to loads, according to some embodiments. The process described in regard to FIG. 9 could be performed on any of the power distribution loops with flow-through junction locations described herein, such as power distribution loop 100 shown in FIG. 1, power distribution loop 202 shown in FIG. 2, power distribution loop 710 or additional power distribution loops 712 shown in FIG. 7.

At 902 electrical power may be fed to a set of electrical rooms and a particular electrical room with a maintenance issue that needs to be addressed. For example, 902 may occur at any point in time once an electrical power distribution system is placed in service. In some embodiments, a maintenance issue may be related to any component downstream of a connection to a junction location corresponding with the particular electrical room. For example, a maintenance issue may be associated with a transformer at the junction location or a piece of equipment in the electrical room. As an illustrative example, data center 200 illustrated in FIG. 2 may have a maintenance issue with a transformer, such as the transformer connected to junction location 220 or a piece of equipment in an electrical room, such as a piece of equipment in electrical room 1. The transformer or the piece of equipment in the electrical room may require maintenance or replacement.

At 904, electrical power continues to flow to the set of electrical rooms. Also, at 906, while electrical power is flowing from the electrical power distribution loop to the set of electrical rooms, a disconnect switch of the particular junction location of the electrical power distribution loop corresponding to the particular electrical room is opened. At 908 the disconnect switch of the particular junction location is connected to a ground connection. Note that a disconnect switch is used in the singular herein, however in some embodiments, a disconnect switch may include multiple switches each for a different phase of power, for example in a three-phase power arrangement. In some embodiments, an alternative power source such as a generator as described in FIG. 6 may supply power to a downstream load, such as an electrical room, while a disconnect switch of a corresponding junction location is open. Continuing the example in regard to FIG. 2, electrical power may continue to flow to electrical rooms 2, 4, and 6 while a disconnect switch of the flow-through junction location 220 corresponding to electrical room 1 is opened and connected to a ground connection.

At 910, in the case of a maintenance issue associated with the transformer at the junction location, the transformer is disconnected from the junction location. At 912, another transformer is connected at the junction location to replace the transformer with the maintenance issue. In some embodiments, the same transformer may be repaired and re-connected at 912. In some embodiments, wherein the maintenance issue is not related to the transformer at the junction location, steps 910 and 912, may be omitted and maintenance on another piece of equipment downstream of the junction location may be performed in place of 910 and 912. Continuing the example in regard to FIG. 2, the transformer connected at junction location 220 may be repaired or replaced or a piece of equipment in electrical room 1 may be repaired or replaced while electrical power continues to flow through power distribution loop 202 and supply power to electrical rooms 2, 4, and 6 via junction locations 222, 224, and 226.

After maintenance is complete, at 914 the disconnect switch is closed. Closing the disconnect switch may energize the transformer at the junction location and the associated electrical room. For example continuing the example in regard to FIG. 2, after the transformer or piece of equipment in electrical room 1 is replaced or repaired, a disconnect switch of junction location 220 may be closed to re-energize electrical room 1.

At 916, electrical power is fed to both the set of electrical rooms and the particular electrical room with a maintenance issue. Note that electrical power continued to flow to the set of electrical rooms while 906-914 were performed. Continuing the example in regard to FIG. 2, once the disconnect switch of junction location 220 is closed electrical power may flow to loads connected via junction location 220 and electrical room 1, such as loads in computing room 1. During this process electrical power may continue to flow to loads in computing rooms 2, 4, and 6 without interruption.

The various methods as illustrated in the figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
   computing rooms;
   electrical rooms comprising electrical equipment configured to distribute electrical power to the computing rooms; and
   an electrical power distribution loop electrically coupled to a utility power source, wherein the electrical power distribution loop comprises feed-through junction locations, each junction location comprising:
  a bus connected at a first end and a second end to the electrical power distribution loop;
  a tap electrically coupled to the bus between the first end and the second end; and
  a disconnect switch electrically coupled downstream of the tap;
wherein a particular one of the junction locations is configured to flow electrical power while a particular one of the electrical rooms is being connected to or disconnected from the particular one of the junction locations, such that electrical power flow through the electrical power distribution loop to electrical rooms electrically coupled to other ones of the junction locations is not interrupted.

2. The data center of claim 1, wherein the electrical power distribution loop is configured to distribute electrical power at a voltage greater than 30 kilovolts (kV).

3. The data center of claim 2, wherein the electrical power distribution loop is configured to carry electrical current at a rate at or exceeding 400 amperes.

4. The data center of claim 1, further comprising:
  transformers, each electrically coupled between a disconnect switch of one of the feed-through junction locations and a corresponding respective electrical room,
  wherein the particular one of the feed-through junction locations is configured to flow electrical power such that electrical power flow through the electrical power distribution loop to the electrical rooms electrically coupled to other ones of the junction locations is not interrupted while a particular transformer is being electrically coupled between the disconnect switch of the particular junction location and the particular electrical room.

5. A system comprising:
  an electrical power distribution system electrically coupled to a utility power source, wherein the electrical power distribution system comprises junction locations, each comprising:
    a bus connected at a first end and a second end to the electrical power distribution system;
    a tap electrically coupled to the bus between the first end and the second end; and
    a disconnect switch electrically coupled downstream of the tap;
  wherein respective junction locations of the electrical power distribution system are electrically coupled to respective electrical rooms of a facility; and
  wherein one of the junction locations is not connected to an electrical room and is configured to be connected to a corresponding electrical room while electrical power flows through the electrical power distribution system to other electrical rooms at the facility electrically coupled to other junction locations of the electrical power distribution system.

6. The system of claim 5, wherein the electrical power distribution system is configured to distribute electrical power at a voltage greater than 1 kilovolt (kV).

7. The system of claim 5, wherein the electrical power distribution system is configured to flow electrical power at a rate at or exceeding 15 megawatts (MW).

8. The system of claim 5, further comprising a transformer, wherein the one of the junction locations is configured to electrically couple with the transformer between the disconnect switch of the one of the junction locations and the corresponding electrical room while electrical power flows through the electrical power distribution system to other electrical rooms electrically coupled to other junction locations of the electrical power distribution system.

9. The system of claim 5, wherein the one of the junction locations further comprises:
  a removable safety enclosure;
  a ground connection included in the disconnect switch or downstream of the disconnect switch; and
  a connection plate configured to couple with a matching connection plate of a transformer.

10. The system of claim 5, wherein the one of the junction locations further comprises:
  a removable safety enclosure;
  a ground connection included in the disconnect switch or downstream of the disconnect switch; and
  a cable connector configured to couple with a cable to couple the one of the junction locations with a transformer.

11. The system of claim 5, wherein the electrical power distribution system comprises an electrical power distribution loop comprising:
  a switching device connected at a first end of the electrical power distribution loop to a first utility power source; and
  a switching device connected at a second end of the electrical power distribution loop to a second utility power source;
  wherein the electrical power distribution loop is configured to feed electrical power to electrical rooms electrically coupled to the junction locations of the electrical power distribution loop from the first utility power source or from the second utility power source.

12. The system of claim 5, wherein the facility is a data center and wherein the electrical power distribution system of the data center is directly coupled to a main switchgear of the data center that receives electrical power directly from a utility power provider.

13. The system of claim 12, wherein the main switchgear of the data center receives electrical power from the utility power provider at a voltage at or exceeding 10 kilovolts (kV).

14. The system of claim 5, wherein the electrical power distribution system comprises underground busses or cables electrically coupled between the junction locations of the power distribution system and configured to distribute electrical power at a rate at or exceeding 15 megawatts (MW).

15. A method comprising:
  feeding electrical power to electrical rooms electrically coupled to an electrical power distribution system via respective junction locations of the electrical power distribution system, wherein each of the respective junction locations of the electrical power distribution system comprises a bus, a tap electrically coupled to the bus, and a disconnect switch between the tap coupled to the bus and a respective one of the electrical rooms that receives electrical power via the respective junction location; and
  while feeding electrical power to the electrical rooms via the respective junction locations, connecting an additional electrical room to another junction location of the electrical power distribution system, wherein electrical power flows through the electrical power distribution system while being connected to the additional electrical room.

16. The method of claim 15, further comprising:
  installing a transformer at the other junction location while electrical power flows through the electrical power distribution system, wherein installing the transformer comprises electrically coupling the transformer between the disconnect switch of the other junction location and the additional electrical room.

17. The method of claim 16, wherein installing the transformer comprises:
coupling a connection plate of the transformer with a matching connection plate of the other junction location to electrically couple the transformer to the electrical power distribution system.

18. The method of claim 16, further comprising:
replacing the transformer with another transformer while electrical power flows through the electrical power distribution system.

19. The method of claim 15, further comprising:
opening, while feeding electrical power to the electrical rooms via the respective junction locations, a disconnect switch of a given one of the respective junction locations to disconnect an outlet end of the given one of the respective junction locations from the electrical power distribution system.

20. The method of claim 19, further comprising:
closing, while feeding electrical power to remaining ones of the electrical rooms via remaining ones of the respective junction locations, the disconnect switch of the given one of the respective junction locations to electrically connect the outlet end of the given one of the respective junction locations to the electrical power distribution system.

\* \* \* \* \*